United States Patent
Edmond et al.

(10) Patent No.: US 7,473,938 B2
(45) Date of Patent: *Jan. 6, 2009

(54) ROBUST GROUP III LIGHT EMITTING DIODE FOR HIGH RELIABILITY IN STANDARD PACKAGING APPLICATIONS

(75) Inventors: John Adam Edmond, Cary, NC (US); Brian Thibeault, Santa Barbara, CA (US); David Beardsley Slater, Jr., Durham, NC (US); Gerald H. Negley, Carrboro, NC (US); Van Allen Mieczkowski, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/539,423

(22) Filed: Oct. 6, 2006

(65) Prior Publication Data
US 2007/0085104 A1   Apr. 19, 2007

Related U.S. Application Data

(60) Division of application No. 10/145,222, filed on May 14, 2002, now Pat. No. 6,825,501, which is a continuation-in-part of application No. 08/920,409, filed on Aug. 29, 1997, now abandoned, which is a continuation of application No. 10/983,983, filed on Nov. 8, 2004, now Pat. No. 7,125,737, which is a continuation of application No. 10/145,222, filed on May 14, 2002, now Pat. No. 6,825,501, which is a continuation-in-part of application No. 08/920,409, filed on Aug. 29, 1997, now abandoned.

(51) Int. Cl.
*H01L 33/00* (2006.01)

(52) U.S. Cl. ................. 257/98; 257/99; 257/103; 257/E33.034; 257/E33.063; 257/E33.064

(58) Field of Classification Search .............. 257/98, 257/99, 103, E33.034, E33.063, E33.064, 257/626
See application file for complete search history.

(56) References Cited

U.S. PATENT DOCUMENTS 4,860,069 A   8/1989   Yamazaki (Continued)

FOREIGN PATENT DOCUMENTS

EP   0357458 A2   3/1990

(Continued)

OTHER PUBLICATIONS

Ishikawa, Hidenori, et al.; "Effects of Surface Treatments and Metal Work Functions on Electrical Properties at p-GaN/Metal Interfaces," J.Appl.Phys., vol. 81, No. 3, Feb. 1, 1997, pp. 1315-1322.

(Continued)

*Primary Examiner*—Minh-Loan T Tran
(74) *Attorney, Agent, or Firm*—Summa, Additon & Ashe, P.A.

(57) ABSTRACT

A physically robust light emitting diode is disclosed that offers high-reliability in standard packaging and that will withstand high temperature and high humidity conditions. The diode comprises a Group III nitride heterojunction diode with a p-type Group III nitride contact layer, an ohmic contact to the p-type contact layer, and a sputter-deposited silicon nitride composition passivation layer on the ohmic contact. The contact layer, the ohmic contact and the passivation layer are made of materials that transmit light generated in the active heterojunction.

20 Claims, 5 Drawing Sheets

U.S. PATENT DOCUMENTS

| | | | |
|---|---|---|---|
| 4,894,703 A | 1/1990 | Hamamsy et al. | |
| 5,077,587 A | 12/1991 | Albergo et al. | |
| 5,113,233 A | 5/1992 | Kitagawa et al. | |
| 5,214,306 A | 5/1993 | Hashimoto | |
| RE34,861 E | 2/1995 | Davis et al. | |
| 5,393,993 A | 2/1995 | Edmond et al. | |
| 5,404,282 A | 4/1995 | Klinke et al. | |
| 5,416,342 A | 5/1995 | Edmond et al. | |
| 5,523,589 A | 6/1996 | Edmond et al. | |
| 5,550,091 A | 8/1996 | Fukuda et al. | |
| 5,563,422 A | 10/1996 | Nakamura et al. | |
| 5,567,523 A | 10/1996 | Rosenblum et al. | |
| 5,578,839 A | 11/1996 | Nakamura et al. | |
| 5,583,351 A | 12/1996 | Brown et al. | |
| 5,585,648 A | 12/1996 | Tischler | |
| 5,592,501 A | 1/1997 | Edmond et al. | |
| 5,616,937 A | 4/1997 | Kitagawa et al. | |
| 5,652,434 A | 7/1997 | Nakamura et al. | |
| 5,708,280 A | 1/1998 | Lebby et al. | |
| 5,739,554 A | 4/1998 | Edmond et al. | |
| 5,767,581 A | 6/1998 | Nakamura et al. | |
| 5,798,537 A | 8/1998 | Nitta | |
| 5,812,105 A | 9/1998 | Van de ven | |
| 5,813,752 A | 9/1998 | Singer et al. | |
| 5,877,558 A | 3/1999 | Nakamura et al. | |
| 5,959,401 A | 9/1999 | Asami et al. | |
| 6,258,617 B1 | 7/2001 | Nitta et al. | |
| 6,344,663 B1 | 2/2002 | Slater, Jr. et al. | |
| 6,445,007 B1 * | 9/2002 | Wu et al. | 257/80 |
| 6,459,100 B1 | 10/2002 | Doverspike et al. | |
| 6,524,971 B1 | 2/2003 | Fetter et al. | |
| 6,586,781 B2 | 7/2003 | Wu et al. | |
| 6,825,501 B2 * | 11/2004 | Edmond et al. | 257/98 |
| 6,946,682 B2 * | 9/2005 | Slater et al. | 257/79 |
| 2001/0023964 A1 | 9/2001 | Wu et al. | |

FOREIGN PATENT DOCUMENTS

| | | |
|---|---|---|
| EP | 0404565 A1 | 12/1990 |
| EP | 0622858 A2 | 11/1994 |
| EP | 1052705 A1 | 11/2000 |
| EP | 1278249 A1 | 1/2003 |
| JP | 07-326823 | 12/1995 |
| JP | 09-191160 | 7/1997 |
| WO | WO 96/24167 A1 | 8/1996 |
| WO | WO 99/10936 | 3/1999 |

OTHER PUBLICATIONS

Sze, Physics of Semiconductor Materials, 2nd Edition (1981) pp. 697-700.

* cited by examiner

ROBUST GROUP III LIGHT EMITTING DIODE FOR HIGH RELIABILITY IN STANDARD PACKAGING APPLICATIONS

CROSS REFERENCE TO RELATED APPLICATION

This application is a divisional of U.S. application Ser. No. 10/145,222, filed May 14, 2002, now U.S. Pat. No. 6,825,501, which is a continuation-in-part of U.S. application Ser. No. 08/920,409, filed Aug. 29, 1997, now abandoned. This application is a continuation of U.S. application Ser. No. 10/983,983, filed on Nov. 8, 2004, now U.S. Pat. No. 7,125,737, which is a continuation of application Ser. No. 10/145,222, filed on May 14, 2002, now U.S. Pat. No. 6,825,501, which is a continuation-in-part of U.S. application Ser. No. 08/920,409, filed Aug. 29, 1997, now abandoned. The disclosures of all these prior applications and issued patents are incorporated entirely herein by reference.

FIELD OF THE INVENTION

The present invention relates to light emitting diodes and in particular relates to such diodes formed from Group III nitrides suitable for standard packaging applications.

BACKGROUND OF THE INVENTION

A light emitting diode is a p-n junction device that converts electrical energy into optical radiation. In particular, under proper forward-biased conditions LED's emit external spontaneous radiation in the ultraviolet, visible, and infra-red regions of the electromagnetic spectrum.

As known to those familiar with the visible and near-visible portions of the electromagnetic spectrum and their characteristics, shorter wavelengths of light (such as blue and ultraviolet) represent higher frequency, higher energy transitions, and longer wavelengths (such as red and infra-red) represent lower frequency, lower energy transitions.

Thus, with respect to light emitting diodes, the particular portion of the spectrum in which they emit—i.e., their color—is based upon the energy of the transitions that create the emissions. In turn, the energy of the transitions is determined to a great extent by the bandgap of the particular material. Thus, in order for a light emitting diode to emit in the blue or ultraviolet portions of the spectrum, the bandgap of the semiconductor material must be large enough (wide enough) to support a transition with sufficient energy to produce blue or ultraviolet light Accordingly, the candidate materials for light emitting diodes in the blue and ultraviolet regions of the spectrum are limited to certain wide bandgap materials such as diamond, silicon carbide (SiC) and Group III nitrides; e.g., binary, ternary and quaternary nitrides formed from the Group III elements of the periodic table such as gallium nitride (GaN), indium gallium nitride (InGaN), and aluminum gallium nitride (AlGaN).

Recent development work in the field of blue LEDs has focused more closely on the Group III nitrides because of their wide bandgaps and their characteristics as direct, rather than indirect, transition materials. As is well understood by those of ordinary skill in this art, a direct band gap material tends to offer higher efficiency because its energy conversion is predominantly in the form of light (a photon) rather than partially as light and partially as vibrational energy (a phonon).

A more extensive discussion of the structure, quantum mechanics, and operation of LEDs and other photonic devices is set forth in Sze, *Physics of Semiconductor Materials,* 2d Edition (1981, John Wiley & Sons, Inc), and its companion, Sze, *Modern Semiconductor Device Physics* (1998, John Wiley & Sons, Inc). These principles are generally well understood in this art and will not be repeated herein other than as necessary to explain and support the claimed invention.

In a basic sense, a light emitting diode generally includes two layers of opposite conductivity type material which together form a p-n junction. These materials are typically in the form of epitaxial layers on a substrate. Most desirably an ohmic contact is made to the substrate and to the top epitaxial layer to form a "vertical" device for optimum efficiency in packaging.

In this regard, an LED is often packaged for end use in the form of an LED lamp. A typical LED lamp includes an LED chip (or "die", the term "chip" often being used to describe an integrated circuit rather than an LED) and a plastic (or sometimes glass) lens. For some LEDs the lens is colored to serve as an optical filter and to enhance contrast, but for blue LEDs the lens is preferably colorless so as to avoid interference with the desired blue emission. Typical lamp configurations are well known to those of ordinary skill in this art and are set forth for example, in Sze, *Physics of Semiconductor Materials,* supra at pages 697-700. Typically, once an LED chip is packaged as a lamp, it can be used for a variety of applications such as indicators and alpha numeric displays.

There are some specific considerations, however, that apply to certain types of devices. For example, Group III nitride devices are typically formed on either sapphire or silicon carbide substrates. Silicon carbide substrates are preferred in many circumstances because silicon carbide (SiC) can be conductively doped. Thus, a silicon carbide substrate can form the basis for a "vertical" device with "top" and "bottom" ohmic contacts. In contrast, the insulating character of sapphire prevents its use in vertical devices.

In turn, n-type SiC substrates tend to be preferred over p-type substrates because n-type SiC is generally more conductive and transmits more light.

As a result, a Group III nitride device on a silicon carbide substrate typically includes an n-type substrate, an n-type buffer layer (or combination of layers), an n-type epitaxial layer, and a p-type contact layer (e.g., GaN) on the "top" of the device.

The development, commercial introduction, and use of such Group III nitride LEDs is relatively recent. Accordingly, it has been determined that in commercial use (the term "commercial" generally refers, but is not limited, to a product that is manufactured and sold on an inventory basis), they suffer from particular types of physical and chemical breakdown that eventually degrade the electronic performance of the devices. More specifically, it has become apparent that under normal environmental conditions, in which LED lamps are operated at or above room temperature and under normal conditions of humidity and other environmental factors, the epitaxial layers, ohmic contacts and associated passivation layers tend to interact with one another resulting in degraded optical and electrical performance. The degradation problem appears to be particularly acute in those devices that include p-type GaN as their top layer, with an ohmic contact to that p-type layer.

A particular form of degradation that is highly undesirable in LED lamps is an increase in forward voltage over time ($V_F$ degradation). "Forward voltage" refers to the voltage that must be applied across the terminals of an LED to cause it to emit light. $V_F$ degradation can lead to higher operating temperatures and increased power consumption over the life of the device.

Thus, in some commercial versions of blue LEDs made from Group III nitrides, the packaging itself is very specific and robust because the LED chip being packaged is relatively fragile even under normal environmental circumstances. For example, in the NSPG630S device from Nichia Chemical Industries of Tokushima, Japan, the p-type layer, the ohmic contact, and the passivation layer are coated with a flexible transparent polymeric material and then encapsulated in a hard resin such as an epoxy-based polymer.

For instance, in European Published Application No. 0 622 858 ("Gallium nitride based III-V group compound semiconductor device and method of producing the same"), Nakamura et al. report that, "(t)he p-electrode (to the p-type gallium nitride) may be formed of any suitable metallic material" (page 6, line 7). Nakamura goes on to list eight candidate metals (Au, Ni, Pt, Al, Sn, In, Cr, and Ti) and names a nickel and gold combination (page 6, lines 10-12 and 33-35) as the preferred selection. Furthermore, in selecting a passivation layer ("protective film"), Nakamura offers some merely general criteria ("The material forming the protective film is not particularly limited, as long as it is transparent, and electrically insulative." Page 9, lines 31-32). Nakamura then goes on to list four candidate materials: silicon dioxide ($SiO_2$), titanium oxide (TiO), aluminum oxide ($Al_2O_3$), and Silicon nitride (SiN).

The more widespread introduction of GaN-based LEDs has demonstrated, however, that such a general selection of materials is inappropriate, and that the resulting LEDs degrade much more rapidly than is otherwise appropriate for useful commercial devices. In particular, LEDs that: (1) include a top epitaxial layer of p-type GaN; (2) use ohmic contacts formed from certain metals (or their combinations) such as titanium and gold ("Ti/Au"); and (3) use silicon dioxide ($SiO_2$) as the passivation layer, tend to exhibit more rapid degradation than is commercially acceptable. More specifically, it appears that the water-permeability of $SiO_2$ allows sufficient moisture to reach the p-electrode to degrade the electrode and eventually the entire device relatively quickly.

As noted above, sophisticated packaging offers one option for protecting a relatively fragile die structure. In order to obtain their fullest commercial potential, however, blue LEDs formed from Group III nitrides must be manufactured in such a manner that they can be incorporated in more common lamp packages analogous to the lamp packages used for materials that are less esoteric than Group III nitrides.

Although the devices described in the '409 application demonstrated improved capabilities, some degradations problems persist.

Accordingly, a continuing need exists for a robust LED chip that can be packaged in normal fashion and yet which will successfully withstand both normal and elevated temperature and humidity conditions, for a time period sufficient to make the devices useful in a wide variety of commercial applications.

OBJECT AND SUMMARY OF THE INVENTION

Embodiments of the invention include a diode that comprises a Group III heterojunction diode with a p-type Group III nitride (and preferably gallium nitride) contact layer, an ohmic contact to the p-type contact layer, and a sputter-deposited silicon nitride passivation layer on the ohmic contact.

In another aspect, the invention comprises an LED lamp formed of the light emitting diode and a plastic lens.

In another aspect, the invention comprises a method of manufacturing an LED comprising the steps of: forming a buffer layer on a substrate, forming an active region on the buffer layer, forming a p-type contact layer on the active region, forming a metal contact on the contact layer, and sputter-depositing a silicon nitride passivation layer on the metal contact.

These and other objects and advantages of the invention will become more readily apparent upon consideration of the following detailed description taken in conjunction with the drawings in which:

DETAILED DESCRIPTION

The present invention is a physically robust light emitting diode that offers high reliability in standard packaging and will withstand high temperature and high humidity conditions.

As noted in the background, ohmic contacts must be protected from physical, mechanical, environmental and packaging stresses to prevent degradation of Group III nitride LEDs.

Figure 1:
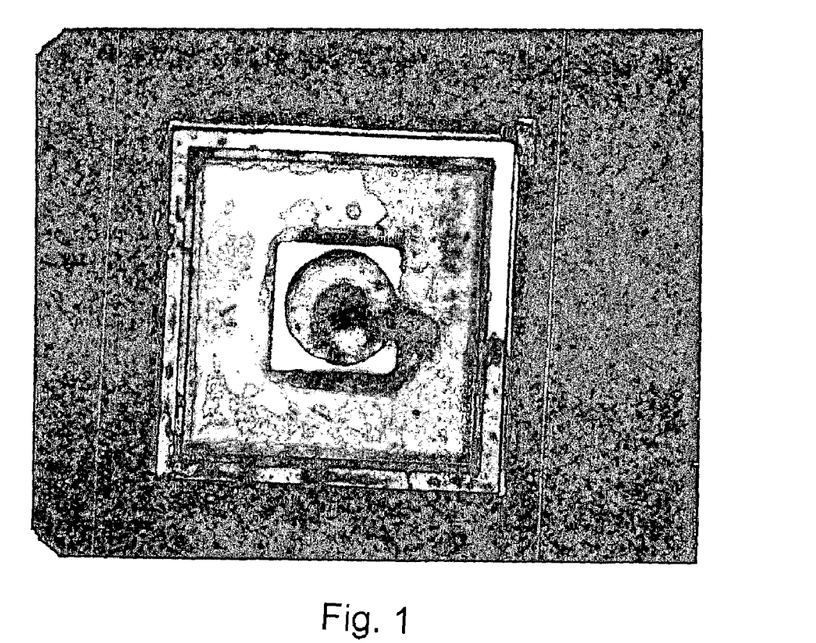
FIG. 1 is a photograph of a gallium nitride based light emitting diode.

In this regard, FIG. 1 is a photograph of an entire LED ("die"). In the device of FIG. 1 the passivation layer of silicon dioxide (glass) has been removed except around the outside edge of the die. The portions where glass is still present are generally indicated by the spotted or stained-appearing portions around the perimeter of the generally square die. This mottled appearance results from a varying gap of air under the glass as it delaminates from the die. In the die illustrated in FIG. 1, the delamination begins at about the three o'clock position (moving clockwise) and reaches approximately the 11:00 o'clock position. The passivation layer is absent from the center of the die and the wire ball bond can be seen at the very center of the die still attached to the bond pad. In this particular example, the center portion of the passivation layer was removed while the die was being de-encapsulated after testing.

The passivation layer of the die illustrated in FIG. 1 had delaminated in the package during testing, and allowed moisture to penetrate beneath the passivation layer. The resulting delamination reduced the initial light output of this particular device by about 20%. Subsequently the moisture, which tends to permeate through the epoxy lens of an LED lamp and around the leads coming out of the bottom of the lamp package, causes the thin semi-transparent ohmic contact to degrade and eventually fail completely. This failure in turn causes the light output to continue to fall and eventually increase the forward voltage of the device. In the device photographed in FIG. 1, the failure of the contact appears as the dark or rough areas just to the right of the center of the die.

Figure 2:
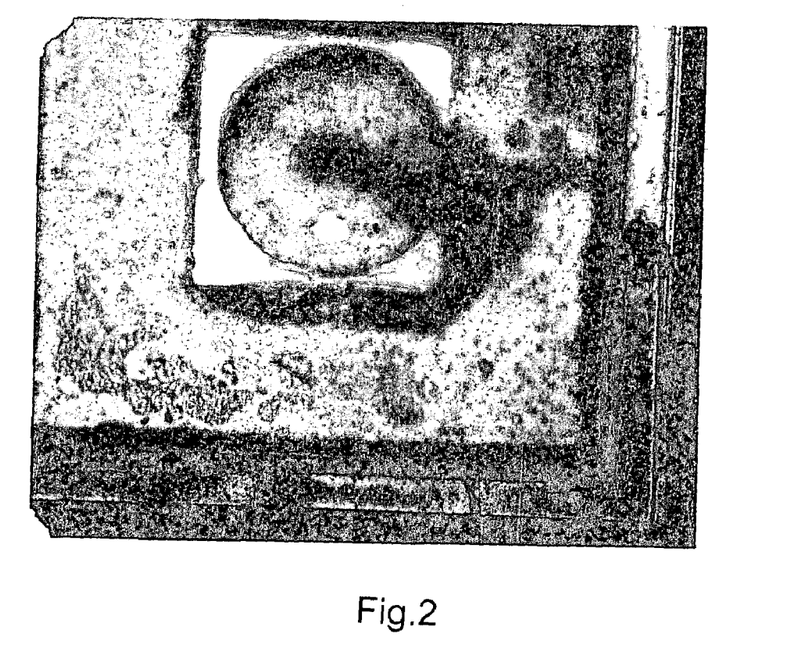
FIG. 2 is a second, somewhat more enlarged photograph of the gallium nitride based light emitting diode of FIG. 1.

FIG. 2 is a magnified view of the die photographed in FIG. 1. FIG. 2 illustrates that the glass remaining on the perimeter has broken off of the inner mesa of the device and that the p-contact has failed. The dark, rough appearing areas are positions where the ohmic contact (titanium and gold in this example) has balled up. As best understood, as the contact becomes less compatible with the p-type layer it tends to bead up rather than wet the p-type layer. In turn, as the Ti/Au balls up around the bond pad, the device slowly becomes disconnected. Furthermore, light is no longer generated in areas where the contact becomes discontinuous. Because a p-type gallium nitride surface is not a good conductor, and generally exhibits high resistivity, the poor current spreading in the void areas fail to provide a current path which would help generate light.

Figure 3:
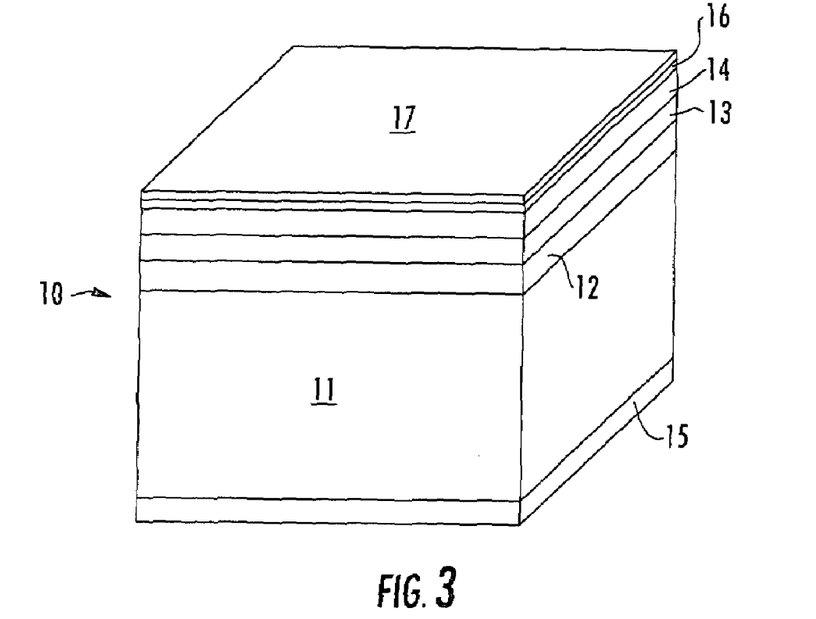
FIG. 3 is a perspective schematic view of an LED according to the present invention.

FIG. 3 illustrates a first embodiment of the diode of the invention that will withstand high temperature and high humidity conditions. The diode is generally designated at 10 and includes a silicon carbide substrate 11, the production and nature of which are clearly set forth in other U.S. patents assigned to assignee of this invention, including for example No. RE 34,861 (formerly U.S. Pat. No. 4,866,005). In preferred embodiments, the silicon carbide substrate is a single crystal selected from the group consisting of the 3C, 4H, 6H, and 15R polytypes of silicon carbide, and is n-type.

In preferred embodiments, the LED of the present invention further comprises a buffer structure 12 on the silicon carbide substrate 11. The buffer structure helps provide a crystalline and mechanical transition from the silicon carbide substrate 11 to the remaining Group III nitride portions of the device. Appropriate buffer structures are set forth for example in U.S. Pat. Nos. 5,393,993; 5,523,589; 5,592,501; and 5,739,554, all of which are commonly assigned with the present invention, and each of which is incorporated entirely herein by reference. The diode 10 further comprises an active region 13 of Group III nitride heterojunction diode structure formed on the buffer structure 12. The active region 13 may comprise a single heterostructure, double heterostructure, single quantum well or multi-quantum well structure. Examples of such structures are disclosed in co-pending and commonly assigned U.S. application Ser. No. 09/154,363 filed Sept. 16, 1998, now U.S. Pat. No. 6,459,100 for "Vertical Geometry InGaN Light Emitting Diode" which is incorporated entirely herein by reference. As explained by Sze, *Physics of Semiconductor Materials,* supra at pages 697-700, the heterostructures and quantum wells serve as active regions in which radiative recombinations lead to light emission.

A p-type Group III nitride contact layer 14 is formed on the active region 13. A metal contact 15 is made to the substrate 11 and another metal contact 16 is made to the p-type gallium nitride epitaxial layer. Preferably, metal contacts 15 and 16 form ohmic (i.e. non-rectifying) contacts to substrate 11 and contact layer 14 respectively. The ohmic contact 16 is selected from the group consisting of platinum, palladium, gold, a combination of titanium and gold, a combination of platinum and gold, a combination of titanium, platinum and gold, or a combination of platinum and indium tin oxide, and is most preferably formed of platinum or palladium. Nickel (Ni) is a preferred ohmic contact metal to the n-type substrate. The device is completed with a passivation layer 17 on the ohmic contact 16, of which appropriate candidate materials are recited above, but that is most preferably formed of silicon nitride.

Silicon nitride is preferred over silicon dioxide in particular because it forms a better seal over the device, preventing contaminants such as water from reaching the epitaxial layers of the device and causing degradation such as is described above. As noted above in the discussion regarding Nakamura's European Published Application No. 0622858, silicon nitride may also be used to form layers that transmit light generated within an LED.

In a most preferred embodiment, the silicon nitride is deposited by means of sputtering. Sputtering is a well known technique for depositing thin layers of material in a vacuum or near-vacuum environment. A technique for sputtering SiN on microwave transistor structures is described in U.S. patent application Ser. No. 09/771,800 entitled "Group III Nitride Based FETs and HEMTs with Reduced Trapping and Method for Producing the Same" filed Jan. 29, 2001, which is hereby incorporated herein by reference.

Figure 5:
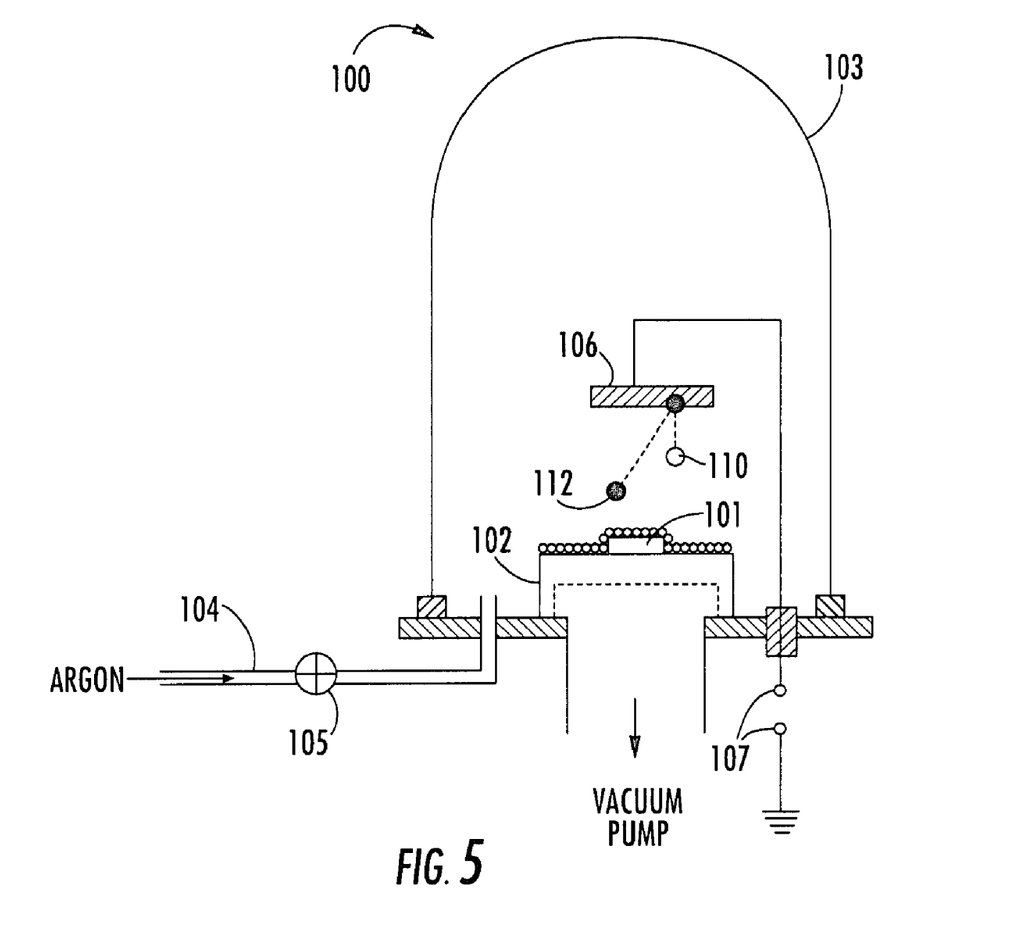
FIG. 5 is a schematic drawing of a sputtering chamber.

FIG. 5 shows a simplified sputtering chamber 100 that can be used to deposit material on a substrate or a device or a device precursor. In operation, a semiconductor device 101 is placed on an anode 102. The chamber 103 is then evacuated and an inert gas 104 such as argon is bled through the valve 105 to maintain a background pressure. The cathode 106 is made of the material (or a component of the material) to be deposited on the substrate or device. With the application of a high voltage between electrodes 107, the inert gas is ionized and the positive ions 110 accelerate to the cathode 106. Upon striking the cathode 106, they collide with the cathode atoms 112, giving them sufficient energy to be ejected. The sputtered cathode atoms 112 travel through space, eventually coating the anode 102 and the semiconductor device 101 on it. Other sputtering units can be more complex and detailed, but they work on much the same basic physical mechanisms. Using the more complex sputtering systems, it is possible to sputter and deposit a range of metals and dielectric layers.

In a preferred embodiment, cathode 106 is a pure silicon target. Nitrogen is provided for silicon nitride formation by flowing nitrogen gas through the sputter chamber 103 along with the inert gas. Because the sputtered target material (in this case, silicon) reacts with a reaction gas (nitrogen) to form SiN, this form of sputtering is known as "reactive sputtering."

In a first embodiment, the sputter deposition may be performed at a temperature in excess of 200° C., and most preferably at a temperature of about 440° C. to maximize encapsulation and produce a more hermetic seal on the device. The pressure of the chamber 103 should be maintained at less than 20 millitorr (mTorr) and preferably between about 10-20 mTorr in a mixed atmosphere of argon and nitrogen gas. The sputter rate should be maintained at about 45 Å/min, and a total film thickness of greater than about 1000 Å should be deposited for optimum encapsulation. In this embodiment, sputtering of silicon nitride may be accomplished using an Endeavor sputtering system manufactured by Sputtered Films, Inc. Although the inventors do not wish to be bound by any particular theory, at this pressure (20 mTorr or less), it is presently believed that the sputtering process causes substantial ion bombardment damage to the device. Nevertheless, it is also presently believed that the increased sputter temperature acts to anneal the ion bombardment damage out of the device.

In this embodiment, the preferred sputtering process includes the specific steps of pumping down the chamber 103 to a low pressure of less than about 20 mTorr, flowing argon gas at a rate of about 40 standard cubic centimeters per minute (sccm), and flowing nitrogen gas flow at a rate of about 25 sccm. The temperature of the chamber 103 is raised above 200° C. and preferably to about 440° C. An RF power of about 100W and a DC power of about 700-800 W is applied to the terminals 107 to create an ionized plasma. This condition is maintained for about 40 minutes to sputter the Si cathode 106. The sputtered silicon reacts with the nitrogen resulting in deposition of silicon nitride on the wafer.

In an alternative embodiment, the sputter deposition may be performed at room temperature but at a higher pressure, e.g. between about 80-100 mTorr in a mixed Ar/$N_2$ atmosphere. A pulsed DC power supply should be used to reduce "spitting" and arcing between the sputter electrodes. Using a pulsed DC power supply increases the amount of ion bombardment on the sputter target, but it has been found that annealing the device to remove ion damage is not needed if the sputter is performed at the higher pressure. It is presently believed that in this embodiment, the peak ion energy of the sputtered ions is reduced while the ion flux is increased, resulting in negligible ion bombardment damage while retaining an acceptable sputter rate. In this embodiment, the sputter rate is preferably maintained at about 50 Å/min, and sputtering may be performed using a CVC 2800 sputtering system.

In this embodiment, the preferred sputtering process includes the specific steps of pumping down the chamber 103 to a pressure of about 80-100 mTorr, flowing argon gas at a rate of about 80 sccm, and flowing nitrogen gas flow at a rate of about 10 sccm. The temperature of the chamber 103 is kept at room temperature. A pulsed DC voltage having a power of about 1000W with a pulse period of about 5 μs and a duty cycle of about 40% is applied to the terminals 107 to create an ionized plasma. This condition is maintained for about 75 minutes to sputter the Si cathode 106. The sputtered silicon reacts with the nitrogen resulting in deposition of silicon nitride on the wafer.

In either of the foregoing embodiments, the silicon nitride is preferably deposited as a silicon nitride composition that is slightly silicon-poor with respect to the stoichiometry of silicon nitride ($Si_3N_4$). That is, the silicon nitride is preferably deposited in a manner that results in a non-stoichiometric composition. Rather, the proportion of silicon in the film is reduced to enhance light extraction. The proportion of silicon in the film may be adjusted by increasing or decreasing the flow of nitrogen gas into the chamber.

Stated differently, as used herein, the term "silicon nitride composition" refers to a composition that includes both silicon and nitride, including silicon and nitrogen chemically bonded to one another, and potentially including some bonded in the stoichiometric relationship of $Si_3N_4$. The composition can also include non-stoichiometric combinations in which the relationship of some or all of the composition is other than $Si_3N_4$.

In the present invention, the sputtered silicon nitride composition is preferred to the conventional plasma enhanced chemical vapor deposition (PECVD) method because the sputtering technique avoids introducing undesirable levels of hydrogen into the SiN film. As is known to those skilled in the art, hydrogen can passivate Mg-acceptors in a GaN-based semiconductor. Although the precise mechanism is not completely understood and the inventors do not wish to be bound by any particular theory of operation, it is currently understood that when silicon nitride is deposited by means of PECVD at a deposition temperature in excess of 200° C., hydrogen in the film can diffuse through the thin ohmic contact and into the p-type Group III nitride contact layer 14, causing layer 14 to become passivated in a region close to the surface thereof. That is, in a region near the surface, a substantial number of acceptor ions are rendered neutral by the introduction of hydrogen in the film. Accordingly, the interface between the ohmic contact and the nitride material is degraded, and the contact metal does not exhibit ideal ohmic characteristics. This can result in an increase in forward voltage ($V_F$ degradation) in the device. Essentially, the device behaves as though the interface between metal 16 and contact layer 14 forms a schottky contact instead of an ohmic contact.

In contrast, because it is deposited in a vacuum or near-vacuum, sputtered the silicon nitride composition is believed to be substantially free of hydrogen impurities. Accordingly, it is also preferable to ensure that all parts of the sputter system are clean and dry to avoid any hydrogen contamination. This may require bake-out of parts prior to sputtering.

In addition, once the LED chip has been manufactured and diced, it is necessary to mount the chip in a lamp package, as described in more detail below. The process of packaging a chip often results in the chip being exposed to high temperatures for a period of time. The chip can also be exposed to high temperatures during subsequent operation. In a chip on which silicon nitride has been deposited using the PECVD method, such exposure can result in an increase in forward voltage over time ($V_F$ degradation). It is presently understood that this voltage increase results from the diffusion of hydrogen from the silicon nitride passivation layer 17 into the Mg-doped contact layer 14. By depositing the silicon nitride composition layer using a sputtering technique (resulting in sputter-deposited silicon nitride composition), the resulting degradation is substantially reduced or eliminated.

If PECVD deposition is unavoidable, it is possible to compensate somewhat for the $V_F$ degradation by doping the Mg-doped contact layer 14 at a higher doping level in order to offset the passivation caused by hydrogen diffusion. However, increasing the doping level of Mg in contact layer 14 can have a detrimental effect on the device by impairing crystal quality and surface morphology in the Mg-doped layer 14.

Figure 6:
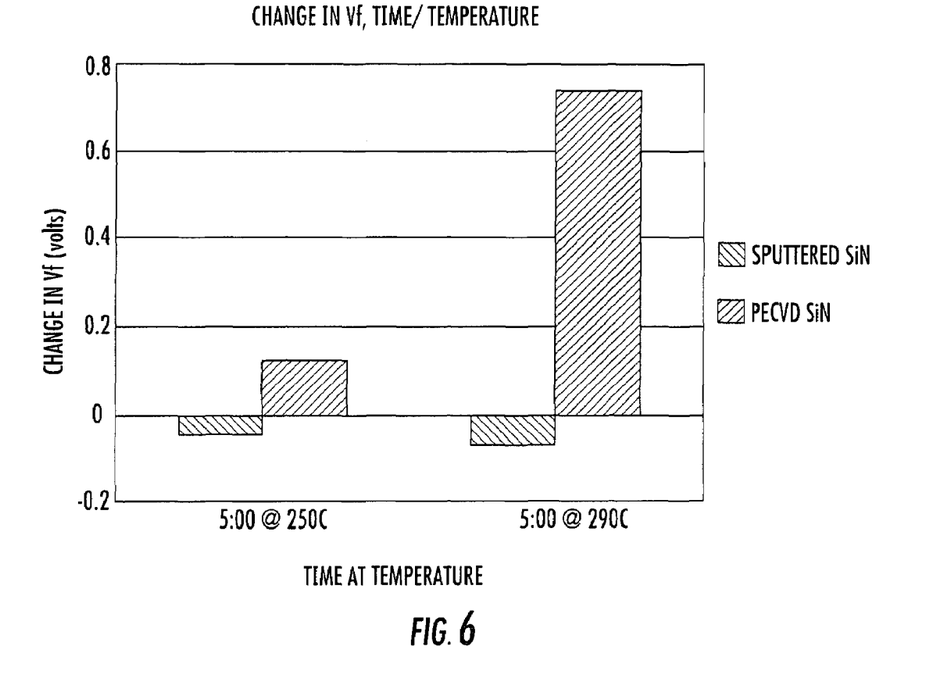
FIG. 6 is a plot of $V_F$ versus anneal temperature LED die processed with PECVD SiN deposition on the one hand and sputtered SiN on the other.

FIG. 6 is a plot of $V_F$ versus anneal temperature for an LED die processed with PECVD silicon nitride deposition on the one hand and the sputtered silicon nitride composition on the other. The LED die were manufactured by depositing epitaxial layers on a silicon carbide substrate. The substrate was then sawed in half. A silicon nitride passivation layer was deposited on each half of the wafer. PECVD deposition was used to deposit the silicon nitride passivation layer on one half of the wafer, and the high-temperature sputtering process described above was used to deposit the silicon nitride composition passivation layer on the other half of the wafer. The remainder of the LED fabrication process was conventional, and LED die were fabricated from each half of the wafer. Five die having sputtered silicon nitride composition and three die having PECVD-deposited silicon nitride passivation layers were subjected to annealing in a rapid thermal anneal chamber for five minutes at an anneal temperature of 250° C. The forward voltage of each die was measured before and after the anneal. The die were then subjected to a subsequent anneal for five minutes at an anneal temperature of 290° C. The forward voltage of each die was measured after the subsequent anneal. The average results from these tests are plotted in FIG. 6. As can be seen in FIG. 6, LEDs on which silicon nitride was deposited using PECVD exhibited an average $V_F$ increase of just over 0.1V after being annealed for five minutes at 250° C., while LEDs on which the silicon nitride composition was sputter deposited showed a slight reduction (i.e. improvement) in $V_F$. LEDs on which silicon nitride was deposited using PECVD exhibited an average $V_F$ increase of over 0.7V after being annealed for five minutes at 290° C., while LEDs on which the silicon nitride composition was sputter deposited showed a reduction in $V_F$ of almost 0.1V after being annealed for five minutes at 290° C.

Accordingly, in one aspect, the present invention includes a method of manufacturing a light emitting diode comprising the steps of: forming a buffer layer on a substrate, forming an active region on the buffer layer, forming a p-type contact layer on the active region, forming a metal contact on the contact layer, and sputter-depositing a silicon nitride composition passivation layer on the metal contact. Preferably, the substrate is a conductive, single crystal silicon carbide substrate, the contact layer comprises Mg-doped GaN and the metal contact comprises platinum.

In the most preferred embodiment, the heterostructure diode is single heterostructure, double heterostructure, single quantum well or multi-quantum well structure such as described in the previously incorporated U.S. application Ser. No. 09/154,363 filed Sep. 16, 1998 for "Vertical Geometry InGaN Light Emitting Diode."

Table 1 summarizes these ohmic contact materials in terms of their suitability for devices according to the claimed invention. In the rating scale used in Table 1, "A" refers to superior characteristics, while "C" refers to generally weak characteristics.

TABLE 1

| Property | Contact | | | | | | |
|---|---|---|---|---|---|---|---|
| | Pt | Pd | Au | Ti/Au | Pt/Au | Ti/Pt/Au | Pt/ITO |
| Ohmic Characteristics | A | A | B | B | A | B | A |
| Minimal Absorption | B | B | A | A | A | B | A |
| Transparency | B | B | A | A | A | B | A |
| Current Spreading | B | B | A | A | A | A | A |
| Adhesion of the Passivation Layer at 85/85/10 | A | A | B | B | B | B | A |
| Chemical Stability | A | B | B | C | B | B | B |

As illustrated in FIG. 3, in preferred embodiments the ohmic contact 16 covers a substantial portion of the p-type gallium nitride contact layer 14 to encourage current spreading across the p-type gallium nitride contact layer 14. Because it covers the light emitting portions of the device, the ohmic contact 16 is preferably thin enough to be semi-transparent. Sze, *Physics of Semiconductor Materials*, supra at page 700, explains that epitaxial layers, such as the contact layer 14, may have a bandgap that is large enough to transmit, rather than absorb, light emanating from the active region 13. The semi-transparent ohmic contact transmits light, therefore, that originates within the active layer 13 and passes through the p-type contact layer 14.

Figures 7, 8:
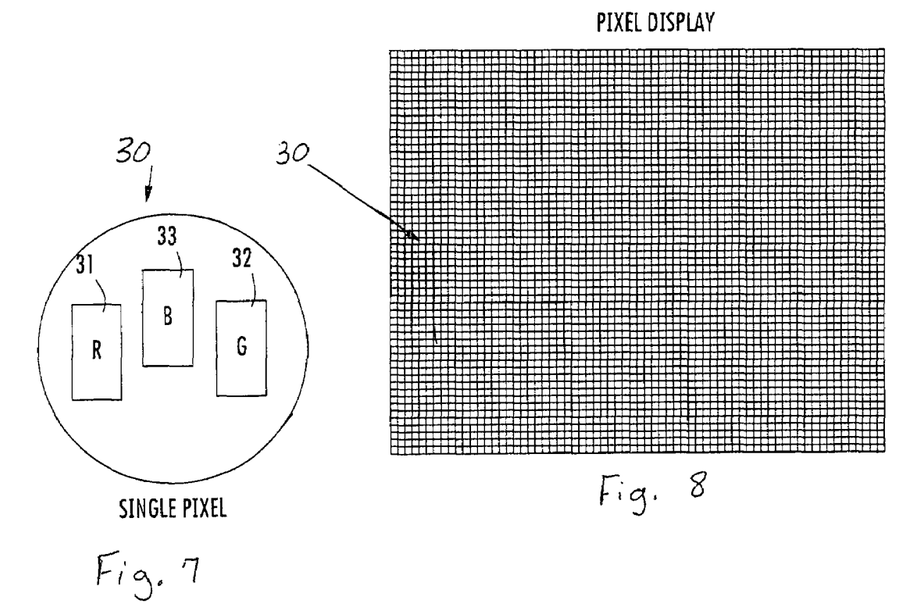
FIG. 7 is an enlarged schematic view of a pixel formed according to the present invention and shown as one of a plurality of pixels in a display.
FIG. 8 is a front view of a pixel display that utilizes a multitude of individual pixels according to this invention.

The diodes illustrated in FIG. 3 can be used in a number of specific applications. One useful application is as a display, typically referred to as "numeric" or "alphanumeric" displays, although certainly not limited to such, that incorporate a plurality of the light emitting diodes according to the invention. An exemplary display is shown in FIG. 7. In this display, blue emitting diodes according to the present invention are incorporated with red and green LEDs to form red-green-blue ("RGB") pixels. FIG. 7 shows one pixel (30) out of a typical display and enlarges that pixel to illustrate the use of red (31), green (32), and blue (33) diodes in a standard pixel. Because such pixels individually produce the three primary colors, they have the capability to produce almost all colors visible to the human eye.

Figure 4:
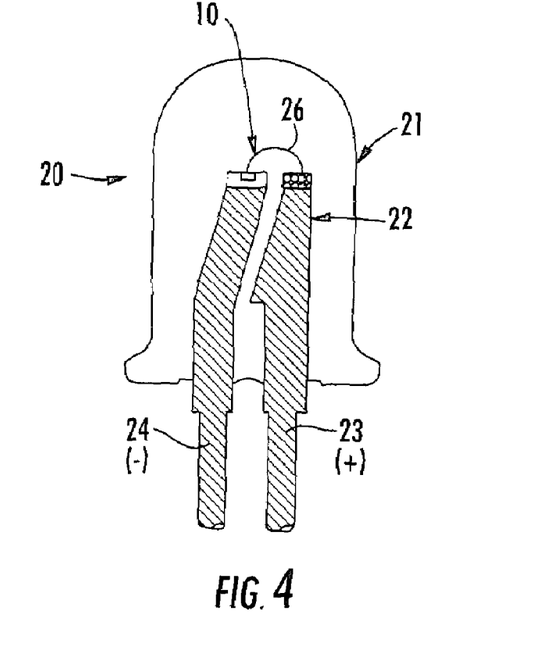
FIG. 4 is a schematic view of an LED lamp that incorporates the diode of the present invention.

In other applications, diodes such as the diode 10 illustrated in FIG. 3 are incorporated into LED lamps. FIG. 4 accordingly illustrates one version of such a typical lamp. It will understood, of course, that FIG. 4 is simply exemplary of the type of lamp structure that can be used to incorporate a diode according to the present and is in no sense limiting of the type of lamp with which the diode of the invention can be used.

In FIG. 4, the lamp 20 includes the diode 10 according to the invention encapsulated in a plastic (i.e., polymeric) lens 21. The plastic material for the lens can be selected from a wide variety of polymeric materials that are well known to those of ordinary skill in this art and without undue experimentation. In many circumstances, the lens 21 is formed of an epoxy resin. The lamp 20 further comprises a metal lead frame 22 for electrically connecting the lamp to other electronic circuit elements. As illustrated in FIG. 4, the metal lead frame 22 incorporates the anode 23 and the cathode 24.

As in the diode embodiment of the invention, a plurality of the lamps 20 can be incorporated to form an appropriate display device. In particular, because gallium nitride devices of this type emit in the blue portion of the visible spectrum, lamps such as those according to the present invention can be advantageously incorporated along with red and green LED lamps to form a full color display. Examples of such displays are set forth in U.S. Pat. No. 5,812,105 issued on Sep. 22, 1998 for "LED Dot Matrix Drive Method and Apparatus."

In the drawings and specification, there have been disclosed typical embodiments of the invention, and, although specific terms have been employed, they have been used in a generic and descriptive sense only and not for purposes of limitation, scope of the invention being set forth in the following claims.

That which is claimed is:

1. A light emitting diode having continuous vertical conductivity throughout a layered body, the diode comprising:
   a light-transmitting contact layer on a light-generating active region;
   a contact on said contact layer, wherein said contact is sufficiently thin to be semi-transparent to light transmitted through said contact layer; and
   a light transmitting passivation layer on said contact layer.

2. A light emitting diode according to claim 1, wherein said active region comprises a heterojunction.

3. A light emitting diode according to claim 2, wherein said heterojunction comprises Group III nitride layers.

4. A light emitting diode according to claim 3 wherein said heterojunction is on a silicon carbide substrate.

5. A light emitting diode according to claim 4, wherein said light emitting diode is vertically conductive from said substrate to said contact on said contact layer.

6. A light emitting diode according to claim 1, wherein said contact is selected from the group consisting of platinum, palladium, gold, alloys of titanium and gold, alloys of platinum and gold, alloys of titanium, platinum and gold, and mixtures of platinum and indium tin oxide.

7. A light emitting diode according to claim 6, wherein said contact is sufficiently thin to allow the transmission of light there through.

8. A light emitting diode according to claim 1, wherein said contact layer comprises a p-type Group III nitride of sufficient band gap to allow light to transmit through the contact layer.

9. A light emitting diode according to claim 1, wherein said passivation layer comprises silicon nitride.

10. A light emitting diode according to claim 9, wherein said passivation layer comprises silicon-poor silicon nitride.

11. A light emitting diode having continuous vertical conductivity throughout a layered body, the diode comprising:
   a Group III nitride, light-emitting active region;

a p-type Group III nitride contact layer on said active region, wherein said contact layer has a sufficiently wide bandgap to transmit light generated in said active region;

a contact on said p-type contact layer, wherein said contact is sufficiently thin to be semi-transparent to light transmitted through said contact layer; and a light transmitting passivation layer on said contact.

12. A light emitting diode according to claim 11, wherein said active region comprises a heterojunction.

13. A light emitting diode according to claim 12, wherein said heterojunction comprises Group III nitride layers.

14. A light emitting diode according to claim 13 wherein said heterojunction is on a silicon carbide substrate.

15. A light emitting diode according to claim 14, wherein said light emitting diode is vertically conductive from said substrate to said contact on said contact layer.

16. A light emitting diode according to claim 15, wherein said contact is selected from the group consisting of platinum, palladium, gold, alloys of titanium and gold, alloys of platinum and gold, alloys of titanium, platinum and gold, and mixtures of platinum and indium tin oxide.

17. A light emitting diode according to claim 16, wherein said contact is sufficiently thin to allow the transmission of light there through.

18. A light emitting diode according to claim 1, wherein said contact layer comprises a p-type Group III nitride of sufficient bandgap to allow light to transmit through the contact layer.

19. A light emitting diode according to claim 11, wherein said passivation layer comprises silicon-poor silicon nitride.

20. An LED lamp comprising:

a plastic lens; and a light emitting diode having continuous vertical conductivity throughout a layered body, the diode comprising:

a Group III nitride heterojunction with a p-type gallium nitride contact layer, wherein said contact has a sufficient bandgap to transmit light generated by said heterojunction;

a contact to said p-type contact layer, wherein said contact is sufficiently thin to be semi-transparent to light transmitted by said contact layer, said contact selected from the group consisting of platinum, palladium, gold, alloys of titanium and gold, alloys of platinum and gold, alloys of titanium, platinum and gold, and mixtures of platinum and indium tin oxide; and a light transmitting passivation layer on said metal contact, wherein said passivation layer comprises a silicon nitride composition.

* * * * *